(12) United States Patent
Sasaki

(10) Patent No.: US 6,996,240 B1
(45) Date of Patent: Feb. 7, 2006

(54) LOUDSPEAKER UNIT ADAPTED TO ENVIRONMENT

(75) Inventor: Atsushi Sasaki, Tokyo (JP)

(73) Assignee: NEC Corporation, (JP)

( * ) Notice: Subject to any disclaimer, the term of this patent is extended or adjusted under 35 U.S.C. 154(b) by 0 days.

(21) Appl. No.: 09/039,072

(22) Filed: Mar. 13, 1998

(30) Foreign Application Priority Data

Mar. 21, 1997 (JP) .................................. 9-068167

(51) Int. Cl.
 H04R 29/00 (2006.01)
 H03G 3/00 (2006.01)
 H03G 5/00 (2006.01)

(52) U.S. Cl. ............................ 381/58; 381/59; 381/63; 381/103

(58) Field of Classification Search ................. 381/66, 381/63, 94.1, 59, 103, 96; 379/406, 410; 333/28 R
See application file for complete search history.

(56) References Cited

U.S. PATENT DOCUMENTS

| 4,628,530 | A | * | 12/1986 | Op De Beek et al. ...... 381/103 |
| 5,146,507 | A | * | 9/1992 | Satoh et al. ................ 381/103 |
| 5,172,417 | A | * | 12/1992 | Iwamura ..................... 381/103 |
| 5,559,891 | A | * | 9/1996 | Kuusama et al. ............. 381/63 |
| 5,572,443 | A | * | 11/1996 | Emoto et al. ................ 381/103 |
| 5,636,323 | A | * | 6/1997 | Umemoto et al. .......... 379/406 |
| 5,687,227 | A | * | 11/1997 | Cohrs et al. ................. 379/410 |
| 5,748,751 | A | * | 5/1998 | Janse et al. .................... 381/66 |
| 5,815,580 | A | * | 9/1998 | Craven et al. ................ 381/59 |
| 5,953,431 | A | * | 9/1999 | Yashima et al. .............. 381/59 |
| 6,141,415 | A | * | 10/2000 | Rao ........................... 379/410 |
| 6,766,025 | B1 | * | 7/2004 | Levy et al. .................... 381/96 |

FOREIGN PATENT DOCUMENTS

| JP | 1-130608 | 5/1989 |
| JP | 1-175497 | 7/1989 |
| JP | 5-181489 | 7/1993 |
| JP | 5-328478 | 12/1993 |
| JP | 6-35463 | 2/1994 |

OTHER PUBLICATIONS

Japanese Office Action issued May 23, 2000 in related application with English translation of relevant portions.

* cited by examiner

Primary Examiner—Laura A. Grier
(74) Attorney, Agent, or Firm—Dickstein, Shapiro, Morin & Oshinsky, LLP.

(57) ABSTRACT

A loudspeaker unit which requires no particular procedure for correction of the acoustic characteristic even if the installation environment of the loudspeaker unit changes, and which can correct, in addition to the frequency characteristic, a sound lag and a phase shift ascribable to the reverberation and an echo of a sound. The loudspeaker unit picks up a sound regenerating from the loud speaker with a microphone, and compares in real time a sound from a sound source with a regenerative sound, referring to a difference therebetween, with reference to the characteristic at an optional frequency and the characteristic of the reverberation or the echo each including the delay time, respectively, and corrects the signal to be sent to the loudspeaker by the result of arithmetic.

10 Claims, 4 Drawing Sheets

LOUDSPEAKER UNIT ADAPTED TO ENVIRONMENT

BACKGROUND OF THE INVENTION

1. Field of the Invention

The present invention relates to a loudspeaker unit for improving the regenerative tone quality, more particularly to a loudspeaker unit particularly adapted to environment.

2. Description of the Related Art

A loudspeaker unit of this type has, as disclosed in J.P.A. Gazette 130608/1989, had a reference signal source for comparative correction to be made in correcting frequency characteristics.

FIG. 1 is a structural view showing an example of a conventional loudspeaker unit of a regenerative sound feed back type having a reference signal source to be used for comparative correction. For amplifying sound source 101 with a desired frequency characteristic, switch 103 of the loudspeaker unit is switched to a fixed contact B side, and a level of a sound signal emitted from reference signal source 102 picked up by microphone 107 at a listening point is analyzed to perform a particular procedure for previously setting a gain of each element of graphic equalizer 104.

However, the loudspeaker unit with a corrected frequency characteristic has a problem such that its frequency characteristic must be corrected by the reference signal every time the installation environment of the loudspeaker unit changes.

Further with the loudspeaker unit in which only correction of the frequency characteristic is executed, there is a problem in that no correction can be made to a sound lag and phase shift caused by the reverbation and echoing of the sound.

SUMMARY OF THE INVENTION

An object of the present invention is to provide a loudspeaker unit adapted to the environment and requires no particular procedure for correction of the acoustic characteristic thereof even if the installation environment of the loudspeaker unit changes.

Another object of the present invention is to provide a loudspeaker unit which can correct, in addition to the frequency characteristic of the sound, a sound lag and a phase shift ascribable to the reverberation and the echo of the sound.

The loudspeaker unit of the present invention comprises a microphone for picking up a sound regenerated from a loudspeaker; processing means for comparing in real time an output signal from the microphone with an output signal from a sound source, in particular by referencing the characteristic at an optional frequency and the characteristics of the reverberation as well as of the echo, each including a delay time, respectively, and correcting the signal from the sound source with the difference output signal between the microphone and the sound source; an amplifier for amplifying the output of the processing means; and a loudspeaker unit.

Also in the present invention, a signal to be sent to the loudspeaker is corrected by the result obtained through an arithmetic operation. Using the result of a comparison operation, a parameter which is used to correct the signal to be sent to the loudspeaker is intermittently renewed.

In the present invention, since the sound characteristic is corrected depending on the regenerative sound source, the correction of the frequency characteristic of the regenerative sound based on the reference signal can advantageously be omitted even if the installation environment of the loudspeaker unit changes.

Further, since the sound picked up by the microphone is compared with the sound from the sound source with reference to the frequency characteristic, the reverberation and the echo characteristic, the invention can effectively correct the reverberation of the sound, the echo delay and the phase shift.

In other words, according to the present invention, the loudspeaker unit does not need a reference signal generator to be used for comparison and a switch for selecting this signal, unlike the prior art.

Further, since the processing module of the loudspeaker unit receives a feedback signal in real time, the procedure described above in the prior art loudspeaker unit is not needed for the correction.

DESCRIPTION OF THE PREFERRED EMBODIMENT

Next, an embodiment of the present invention will be described in detail with reference to the drawings.

Figure 1:
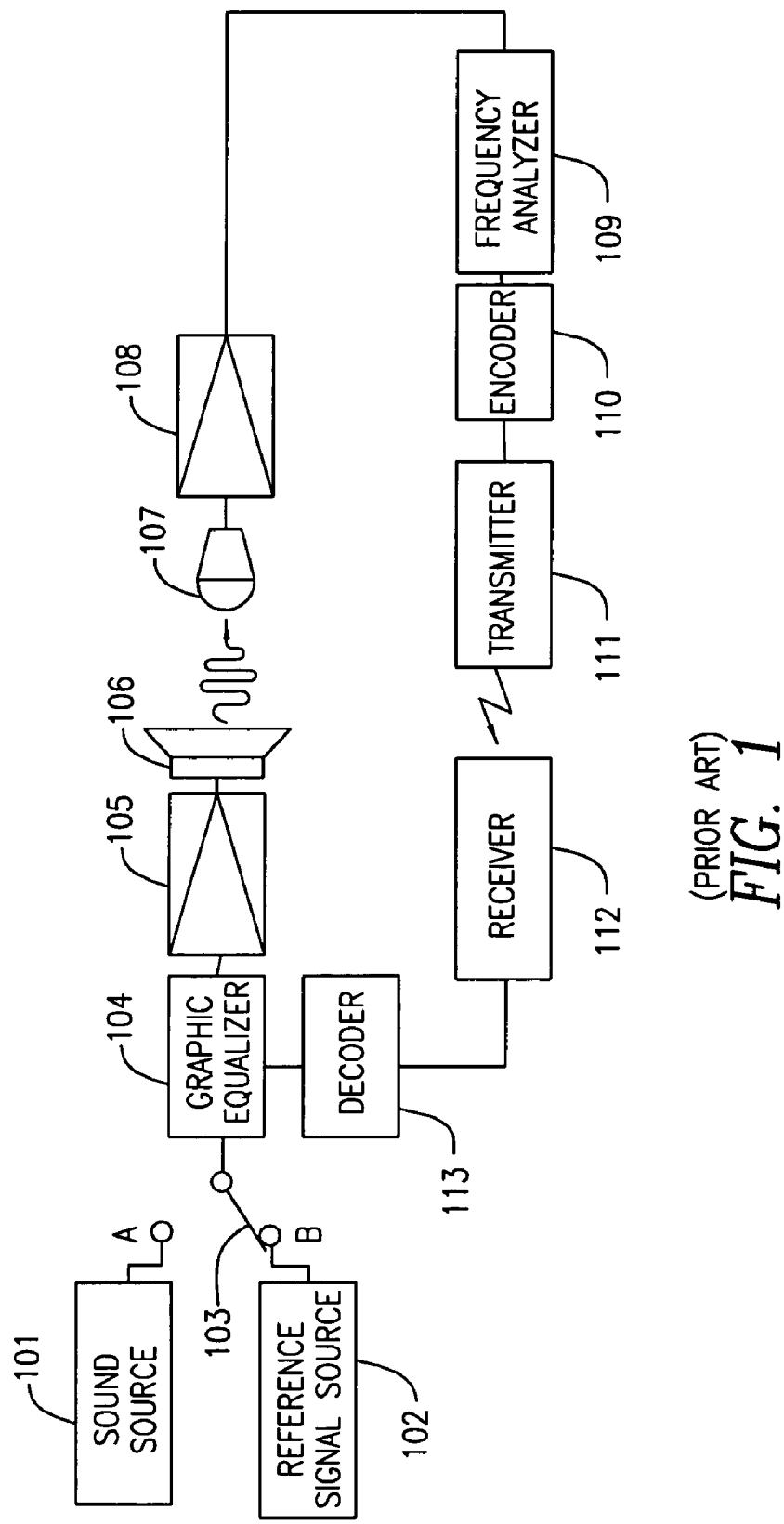
FIG. 1 is a structural view showing an example of a conventional loudspeaker unit of a regenerative sound feed back type having a reference signal source for use for comparative correction.
Figure 2:
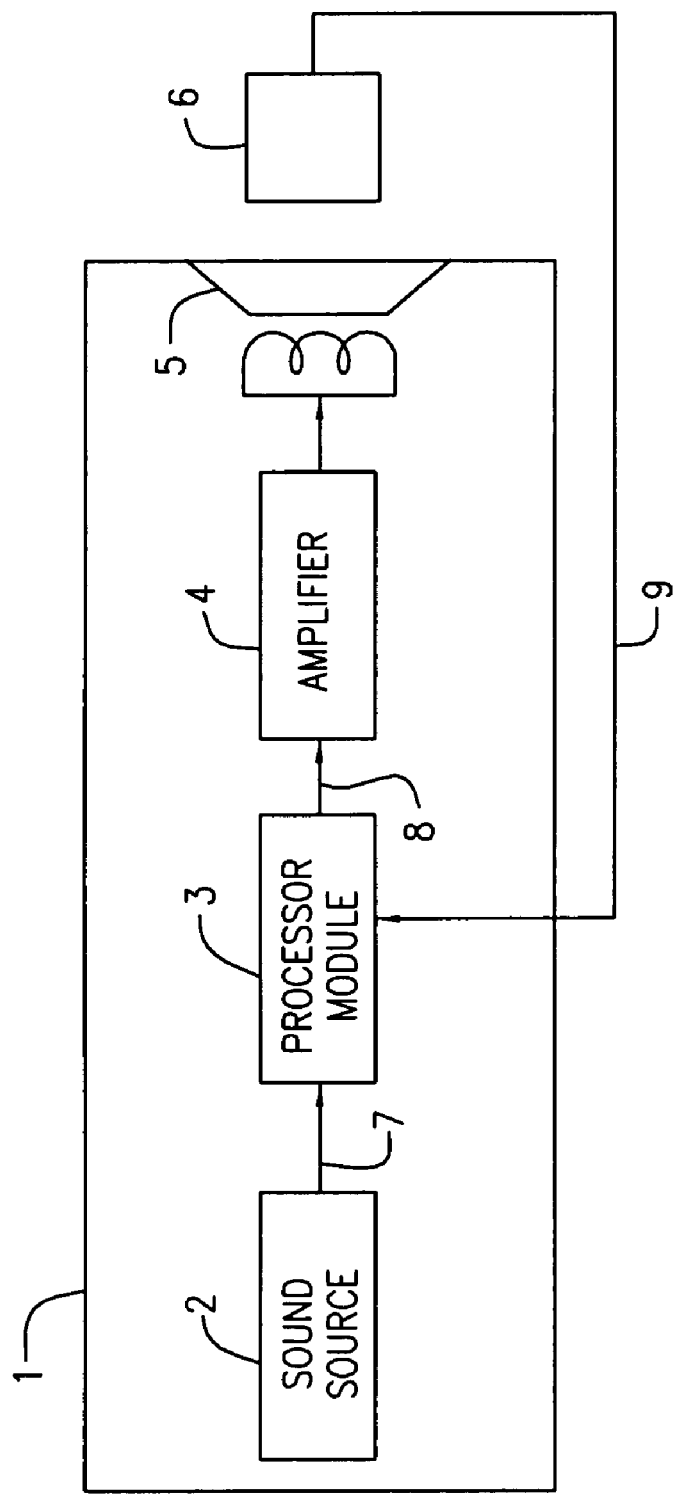
FIG. 2 is a structural view showing an embodiment of a loudspeaker unit adapted to the environment accordance with the present invention.

With reference to FIG. 2, there is provided loudspeaker unit 1 adapted to the environment comprising microphone 6 for picking up a sound issued from the loudspeaker 5, processor module 3 for receiving feedback signal 9 and sound source signal 7, and amplifier 4 for producing the sound from loudspeaker 5.

Next, the operation of the circuit of FIG. 2 will be described with reference to the drawing.

Sound source signal 7 of sound source 2 to be desirably regenerated is inputted to processor module 3 before it is inputted to amplifier 4. Processor module 3 compares feedback signal 9 inputted from microphone 6 with sound source signal 7. Processor module 3 applies correction data to the sound source signal to produce a correction signal and which applied to amplifier 4 and will cause loudspeaker 5 to generate a sound (which in turn causes microphone 6 to generate a feedback signal 9) which is as close as possible to the original sound source signal 7. As a result, the system will obtain a reasonable sound intensity characteristic or the desirable effect of echo suppression. Since the sound generated by loudspeaker 5 has been corrected in real time with reference to the frequency characteristic or the reverberation characteristic characteristic of the room in which the loudspeaker 5 is located, correction signal 8 approaches sound source signal 7.

Figure 3:
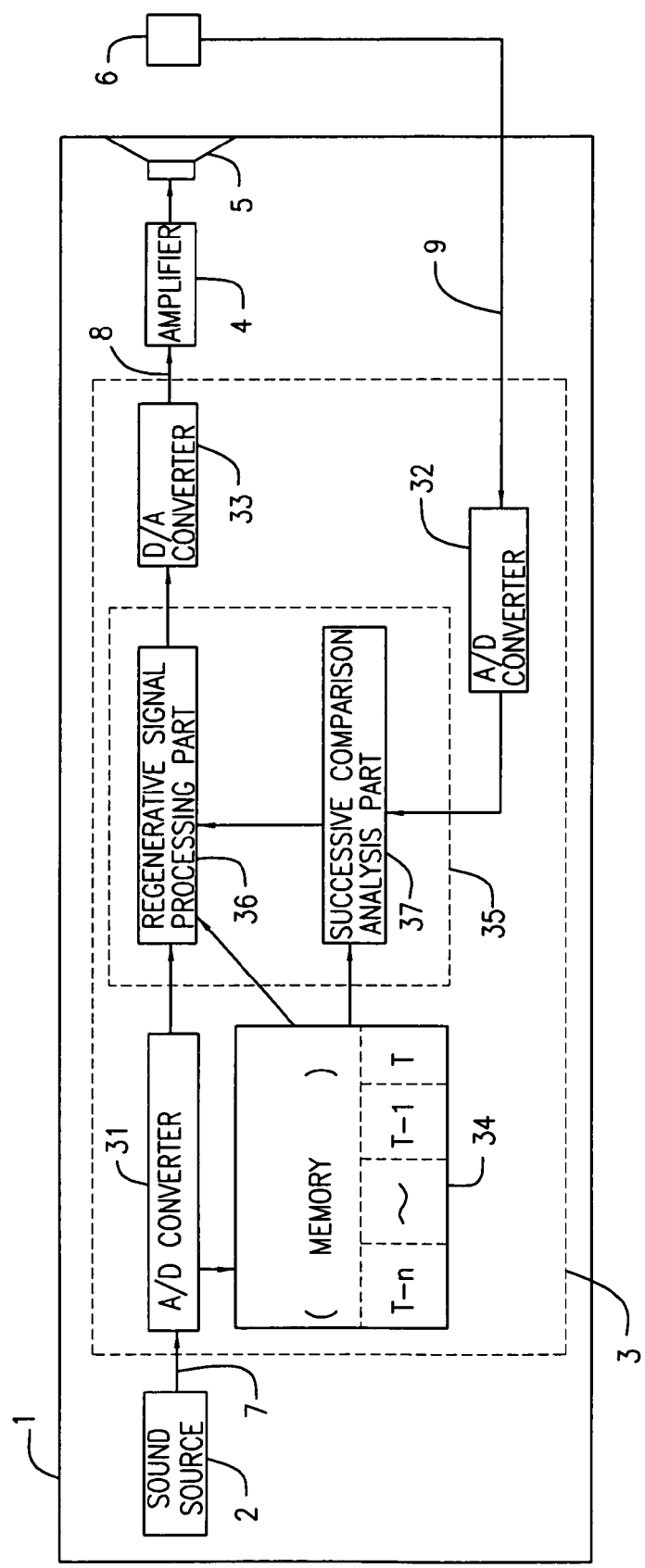
FIG. 3 is a structural view showing a concrete embodiment of a loudspeaker unit adapted to the environment in accordance with the present invention.

Next, a concrete embodiment of the present invention will be described in detail referring to the drawings. With reference to FIG. 3, sound source 2 is any sound source such as a radio tuner, a compact disk or a sound chip of a personal computer. Processor module 3 comprises 16 bit A/D converter 31, 16 bit A/D converter 32, digital signal processor 35, 16 bit D/A converter 33, and memory 34. Amplifier 4 is on operational amplifier. It drives loudspeaker 5 to 57 mm in diameter with impedance of 8 Ω. Microphone 6 is composed of an electret condenser microphone of 9.5 mm in diameter with a flat frequency characteristic and a microphone amplifier. A cable which transmits feedback signal 9 outputted from microphone 6 is selected from a group of the noise-resistant shielding wire.

Next, the operation of the embodiment of the present invention will be described in detail with reference FIG. 3.

Signal 7 from sound source 2 is converted to a digital signal by A/D converter 31 of processor module 3 and stored in memory 34. The data of all signals A/D converted within a fixed time stipulated for the reverberation and the echo are stored as the data of sound source 2 in memory 34. On the other hand, a signal processed as a regenerative signal by digital signal processor 35 of processor module 3 is further converted to an analog signal by means of D/A converter 33, amplified by amplifier 4, and applied to loudspeaker 5 which generates a corresponding sound. Microphone 6 picks up this sound, and converts it into a feedback signal 9 which is converted into a digital signal by A/D converter 32 and inputted to digital signal processor 35. Successive comparison analysis part 37 of digital signal processor 35 compares the data of sound source 2 stored in memory 34 with digital data from successive A/D converter 32, analyzes the intensity of the reverberation and the echo, corrects the conversion data stored in memory 34 and obtains a correction parameter. Regenerative signal processing part 36 adds the correction parameter to the conversion data of sound source 2 and processes the digital data to regenerate it as a regenerative signal. The difference between the data of sound source 2 and the data of feedback signal 9 is obtained as the correction parameter in serial data and the parameter is processed by adding feedback signal 9 of an opposite phase, if necessary, to obtain a fixed number of 0. The processed signal is converted to an analog signal by D/A converter 33, amplified by amplifier 4 and then sent forth from loudspeaker 5 as the sound.

The intensity of the reverberation and the change of the frequency characteristic are corrected according to the result obtained with respect to the data of sound source 2. After analyzing the frequency characteristic and the delay attributable to the reverberation as well as the echo, the value set for correction is changed to determine the correction parameter.

Next, a second embodiment of the present invention will be described referring to the drawings.

Figure 4:
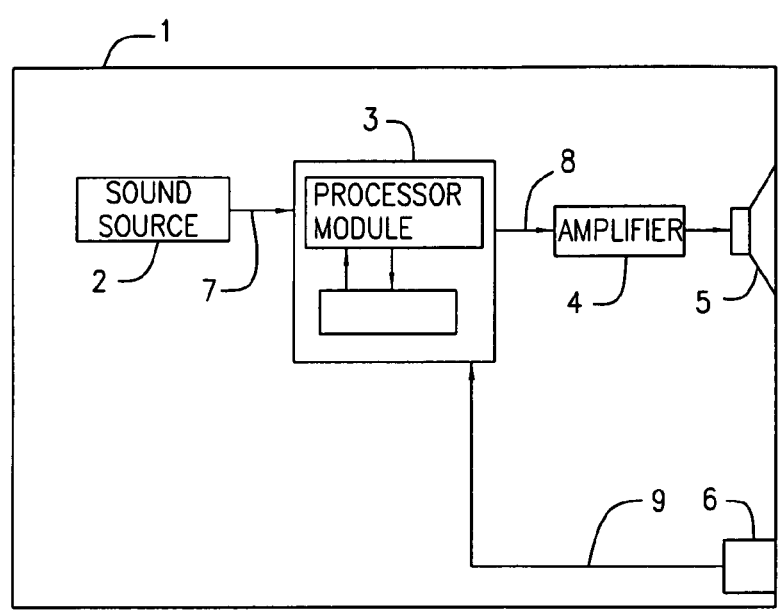
FIG. 4 is a structural view showing another embodiment of a loudspeaker unit adapted to the environment in accordance with the present invention.

With reference to FIG. 4, in order to decrease the load of processor module 3, data processing for the correction process is not performed in real time, but a correction parameter previously extracted from the past feed back iteration is used intermittently. Thus, it becomes possible to correct the sound delay and the phase shift which may be caused by reverberation and echo of the sound.

Further, by attaching microphone 6 to a casing of loudspeaker unit 1 of the present invention, any wiring which would otherwise be exposed outside of the casing can be omitted.

Further, by attaching microphone 6 to a casing of loudspeaker unit 1 of the present invention, the wiring to be laid outwardly from the casing can be omitted.

What is claimed is:

1. A loudspeaker unit for a sound source, the loudspeaker unit being adaptable to changing environments, the loudspeaker unit comprising:
   a loudspeaker;
   a microphone for picking up sound regenerated from the loudspeaker;
   a processor for generating a difference by comparing, in real time, a direct output signal from the microphone with an output signal from the sound source with reference to a frequency characteristic and an echo characteristic of the sound regenerated from the loudspeaker, or a reverberation characteristic of the sound, including a delay time for the echo characteristic or the reverberation characteristic, the processor further generating a processor output by correcting the output signal from the sound source using the difference;
   an amplifier for amplifying the processor output; and
   a memory for storing a converted voice data of samples taken within a fixed time determined as a subject time for the delay of the reverberation characteristic or the echo characteristic.

2. A loudspeaker unit adapted to the environment according to claim 1 wherein,
   the frequency comparison of the characteristic and the comparison of the characteristic of the echo or the reverberation each including the delay time are learned by arithmetic and a signal to be sent to the loudspeaker is corrected according to the learned result.

3. A loudspeaker unit adapted to the environment according to claim 2 wherein,
   the frequency comparison of the characteristic and the comparison of the characteristic of the echo or the reverberation each including the delay time are intermittently performed and a signal to be sent to the loudspeaker is corrected according to the comparison result.

4. A loudspeaker unit adapted to the environment according to claim 1 wherein,
   the frequency comparison of the characteristic and the comparison of the characteristic of the echo or the reverberation each including the delay time are intermittently performed and a signal to be sent to the loudspeaker is corrected according to the comparison result.

5. A loudspeaker unit for a sound source, the loudspeaker unit being adaptable to changing environments, the loudspeaker unit comprising:
   a loudspeaker;
   a microphone for picking up sound regenerated from the loudspeaker;
   a processor for generating a difference by comparing, in real time, a direct output signal from the microphone with an output signal from the sound source with reference to a frequency characteristic and an echo characteristic of the sound regenerated from the loudspeaker, or a reverberation characteristic of the sound, including a delay time for the echo characteristic or the reverberation characteristic, the processor further generating a processor output by correcting the output signal from the sound source using the difference; and an amplifier for amplifying the processor output adapted to the environment wherein said processor for correcting the signal from said sound source comprising:

a first A/D converter for performing digital conversion of a sound signal outputted from the sound source;

a memory for storing a converted voice data of samples taken within a fixed time determined as a subject time for the delay of the reverberation characteristic or the echo characteristic;

a second A/D converter for performing digital conversion of the feedback signal outputted from said microphone as the feedback data;

a successive comparison analysis part for successively comparing said feedback data with the stored voice data, analyzing the intensity of the reverberation characteristic or the echo characteristic and outputting the result as a correction parameter;

a regenerative signal processing part for adding data corrected by said correction parameter to the stored voice data and processing the result as the regenerative data; and a D/A converter for converting said regenerative data to an analog signal.

6. A loudspeaker unit adapted to the environment according to claim 5 wherein the successive comparison analysis part performs processing by adding antiphase feedback data to voice data so that the difference between said voice data obtained as the serial data and said feedback data becomes a fixed value or 0.

7. A loudspeaker unit adapted to the environment according to claim 5, wherein, the frequency comparison of the characteristic and the comparison of the characteristic of the echo or the reverberation each including the delay time are learned by arithmetic and a signal to be sent to the loudspeaker is corrected according to the learned result.

8. A loudspeaker unit adapted to the environment according to claim 7 wherein, the frequency comparison of the characteristic and the comparison of the characteristic of the echo or the reverberation each including the delay time are intermittently performed and a signal to be sent to the loudspeaker is corrected according to the comparison result.

9. A loudspeaker unit adapted to the environment according to claim 5, wherein, the frequency comparison of the characteristic and the comparison of the characteristic of the echo or the reverberation each including the delay time are intermittently performed and a signal to be sent to the loudspeaker is corrected according to the comparison result.

10. A loudspeaker unit for a sound source, the loudspeaker unit being adaptable to changing environments, the loudspeaker unit comprising:

a loudspeaker;

a microphone for picking up sound regenerated from the loudspeaker;

a processor for generating a processor output by correcting an output signal from the sound source using a difference in a direct output signal from the microphone with an output signal from the sound source with reference to a frequency characteristic and an echo characteristic of the sound regenerated from the loudspeaker, or a reverberation characteristic of the sound, including a delay time for the echo characteristic or the reverberation characteristic;

an amplifier for amplifying the processor output; and a memory for storing a converted voice data of samples taken within a fixed time determined as a subject time for the delay of the reverberation characteristic or the echo characteristic.

* * * * *